United States Patent
Zhu et al.

(10) Patent No.: US 7,700,508 B1
(45) Date of Patent: Apr. 20, 2010

(54) LOW CONDUCTIVITY AND HIGH TOUGHNESS TETRAGONAL PHASE STRUCTURED CERAMIC THERMAL BARRIER COATINGS

(75) Inventors: Dongming Zhu, Westlake, OH (US); Robert A. Miller, Brecksville, OH (US)

(73) Assignee: The United States of Americas as represented by the Secretary of the Army, Washington, DC (US)

( * ) Notice: Subject to any disclaimer, the term of this patent is extended or adjusted under 35 U.S.C. 154(b) by 767 days.

(21) Appl. No.: 11/510,574

(22) Filed: Aug. 28, 2006

Related U.S. Application Data

(60) Provisional application No. 60/712,613, filed on Aug. 26, 2005.

(51) Int. Cl.
*C04B 35/48* (2006.01)

(52) U.S. Cl. .................. 501/103; 501/126; 501/152; 501/127

(58) Field of Classification Search .................. 501/102, 501/126, 152, 5, 27, 103
See application file for complete search history.

(56) References Cited

U.S. PATENT DOCUMENTS

| | | | |
|---|---|---|---|
| 4,774,150 A | 9/1988 | Amano et al. | |
| 5,562,998 A | 10/1996 | Strangman | |
| 5,830,816 A | 11/1998 | Burger et al. | |
| 6,103,386 A | 8/2000 | Raybould et al. | |
| 6,319,614 B1 | 11/2001 | Beele | |
| 6,387,526 B1 | 5/2002 | Beele | |
| 6,395,343 B1 | 5/2002 | Strangman | |
| 6,452,957 B1 | 9/2002 | Burger et al. | |
| 6,812,176 B1 * | 11/2004 | Zhu et al. ................... | 501/102 |
| 6,835,465 B2 | 12/2004 | Allen et al. | |
| 6,875,529 B1 | 4/2005 | Spitsberg et al. | |
| 6,887,595 B1 | 5/2005 | Darolia et al. | |
| 6,890,668 B2 | 5/2005 | Bruce et al. | |
| 7,001,859 B2 * | 2/2006 | Zhu et al. ................... | 501/102 |
| 2002/0028344 A1 | 3/2002 | Beele | |
| 2002/0172837 A1 | 11/2002 | Allen et al. | |
| 2004/0043244 A1 | 3/2004 | Bruce et al. | |
| 2005/0064245 A1 | 3/2005 | Campbell | |
| 2005/0142392 A1 * | 6/2005 | Spitsberg et al. ............ | 428/701 |
| 2005/0142393 A1 | 6/2005 | Boutwell et al. | |
| 2005/0142395 A1 * | 6/2005 | Spitsberg et al. ............ | 428/701 |
| 2005/0170200 A1 | 8/2005 | Nagaraj et al. | |
| 2006/0019119 A1 | 1/2006 | Spitsberg et al. | |

OTHER PUBLICATIONS

Zhu et al. Defect Clustering and Nanophase Structure Characterization of Multicomponent Rare Earth-Oxide-Doped Zirconia-Yttria . . . , NASA TM-2004-212480, ARL-TR-3014, Jan. 2004.
Zhu et al. Thermal Conductivity and Sintering Behavior of Advanced Thermal Barrier Coatings, 26th Annual International Conf. on Advanced Ceramics and Composites, Jan. 2002.

* cited by examiner

*Primary Examiner*—Gwendolyn Blackwell
(74) *Attorney, Agent, or Firm*—Edward L. Stolarun; A David Spevack

(57) ABSTRACT

A composition for thermal barrier coatings exhibiting improved thermal conductivity and toughness is provided. The composition is comprised of a base majority oxide, a first dopant oxide, at least one small rare earth oxide, at least one large rare earth oxide and at least one toughening oxide. Compared to traditional thermal barrier coatings, a composition of the present invention provides approximately twice the toughness one-third to one-half the thermal conductivity.

12 Claims, 4 Drawing Sheets

LOW CONDUCTIVITY AND HIGH TOUGHNESS TETRAGONAL PHASE STRUCTURED CERAMIC THERMAL BARRIER COATINGS

RELATED APPLICATION

This application claims priority of U.S. Provisional Patent Application Ser. No. 60/712,613 filed Aug. 26, 2005, which is incorporated herein by reference.

GOVERNMENT INTEREST

The invention described herein may be manufactured, used, and licensed by or for the United States Government.

FIELD OF THE INVENTION

The present invention relates in general to thermal barrier coatings and in particular to thermal barrier coatings with low conductivity and high toughness.

BACKGROUND OF THE INVENTION

In hot-sections of gas turbines and other heat engines, high temperature protective coatings are necessary to protect engine components and improve engine reliability. Alloyed metallic coatings that form protective, slow growing oxide scales such as alumina ($Al_2O_3$) and chromia ($Cr_2O_3$) have been designed and used as oxidation and corrosion resistant coatings, thus enabling load-bearing components to exhibit extended service lives due to the prevention of fast oxidation and corrosion degradations occurring under high temperature, oxidation and thermal cycling conditions. However, these metallic coatings have a limited temperature capability, with most applications limited to less than 1000° C. Thus large amounts of cooling air are required to reduce component temperatures, even under moderate engine operating temperatures, and engine performance and efficiency are severely limited due to component temperature capability.

In order to increase the temperature capability of engine components, thermal barrier coatings have been developed and applied to component surfaces. Thermal barrier coatings are thin ceramic layers, generally applied by plasma-spraying or physical vapor deposition techniques, used to insulate air-cooled metallic components from high temperature gases. Such coatings are useful in protecting and extending the service life of metallic and ceramic components exposed to high temperatures, such as jet engine turbine blades, vanes and combustors.

Thermal barrier coatings comprised of zirconia-yttria ($ZrO_2$—$Y_2O_3$) are well known in the art, wherein yttria typically is present from 7 to 9 weight percent (wt %) (4 to 5 molar percent), and have been widely used in more advanced engine systems. These coatings are typically applied using plasma-spraying or physical vapor deposition in which melted ceramic particles or vaporized ceramic clouds are deposited onto the surface of the component to be protected. Thermal barrier coatings are designed to be porous, with overall porosities generally in the range of 5 to 20%. The porosity serves to reduce the coatings thermal conductivity below the intrinsic conductivity of the dense zirconia-yttria ceramic, and thus retards the flow of heat from the hot gases to the underlying component surface.

As operating temperatures continue to increase, current zirconia-yttria coating conductivities (approximately 2.5 W/m-K) are not acceptable (i.e. too high) for future high performance, low emission turbine engines currently under development. Moreover, the phase and microstructural stability of the current zirconia-yttria coatings remain a significant issue. For example, the destabilization of the zirconia-yttria phases starting at temperatures ranging between 1200-1300° C. may result in the coatings premature spallation. Furthermore, phase destabilization aids in the sintering of a zirconia-yttria coating during high temperature service, thereby decreasing porosity, increasing thermal conductivity and reducing the coatings effectiveness. In summary, the coating and component durability are adversely impacted by the degradation of the coating phase structure and properties associated with higher temperature aging effects. Thus, an improved thermal barrier coating is required for advanced engine applications.

SUMMARY OF THE INVENTION

A composition for thermal barrier coatings exhibiting improved toughness and thermal conductivity is provided. The composition is comprised of a base majority oxide, a first dopant oxide, at least one small rare earth oxide, at least one large rare earth oxide and at least one toughening oxide. The base majority oxide is selected from the group consisting of an oxide of zirconium, hafnium and combinations thereof, and the first dopant oxide is selected from the group consisting of an oxide of yttrium, dysprosium, erbium and combinations thereof. The at least one small rare earth oxide is selected from the group consisting of an oxide of ytterbium, holmium, lutetium and combinations thereof, and the at least one large rare earth oxide is selected from the group consisting of an oxide of neodymium, samarium, europium, gadolinium and combinations thereof. The at least one toughening oxide is selected from the group consisting of an oxide of titanium, tantalum, niobium, scandium and combinations thereof. Compared to traditional thermal barrier coatings, a composition according to the present invention provides approximately twice the toughness and one-third to one-half the thermal conductivity.

DESCRIPTION OF THE PREFERRED EMBODIMENTS

Figure 1:
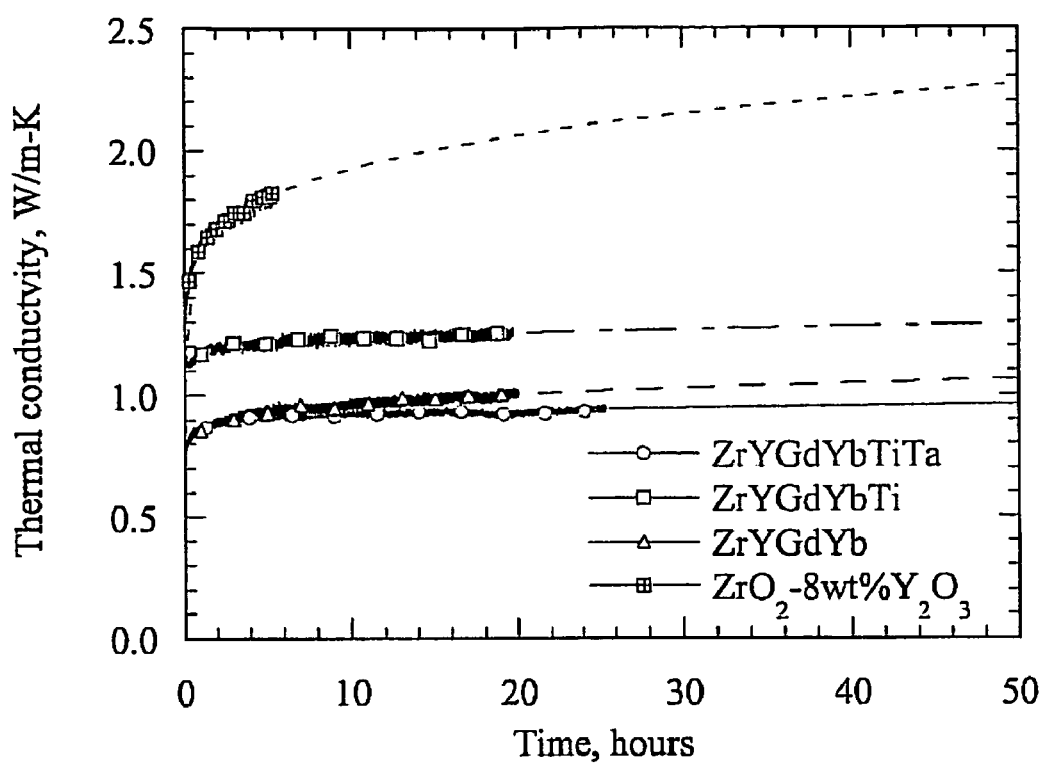
FIG. 1 is a graphical representation of the thermal conductivity behavior of plasma-sprayed, multi-component, tetragonal phase structured low conductivity thermal barrier coatings as a function of testing time.

A new multi-component low conductivity high toughness (LCHT) thermal barrier coating composition is provided. The advanced LCHT coating has a partially stabilized non-transformable tetragonal t' structure, based on a four-component, low conductivity system that emphasizes higher total dopant content. The four-component low conductivity system achieves a thermal conductivity reduction in the range of one-half to one-third of the current state-of-the-art baseline zirconia-7 wt % yttria coatings. The present invention simultaneously incorporates two additional paired transition metal oxide toughening dopants into a tetragonal phase structured four-component coating system. The incorporation of the toughening dopants significantly improves the toughness and erosion resistance of the coating system while improving the thermal stability and maintaining, and sometimes even lowering, the thermal conductivity.

The four-component coating system includes a base oxide selected from a group consisting of zirconia ($ZrO_2$), hafnia ($HfO_2$) and combinations thereof. A primary stabilizer dopant, comprising a second component, is selected from the group of rare earth oxides consisting of yttria ($Y_2O_3$), dysporia ($Dy_2O_3$), euria ($Eu_2O_3$) and combinations thereof. The third and fourth components are comprised of cluster dopant oxides that promote the formation of extended defects and defect clusters in order to reduce the oxide intrinsic thermal conductivity and sintering rates. The third component cluster dopant oxide is selected from a group consisting of rare earth oxides, said oxides having a smaller ionic size than that of the primary stabilizer component and/or the base oxide component. This group of rare earth oxides is selected from an oxide of ytterbium, holmium, lutetium and combinations thereof. The fourth component cluster dopant oxide is selected from a group consisting of rare earth oxides, said oxides having a larger ionic size than that of the primary stabilizer component and/or the base oxide component. This group of rare earth oxides is selected from an oxide of neodymium, samarium, europium, gadolinium and combinations thereof.

Adding to the four-component low conductivity system, the present invention incorporates at least one toughening oxide selected from the group consisting of an oxide of titanium, tantalum, niobium, scandium and combinations thereof. Thus one embodiment of the present invention is a thermal barrier coating illustrated by:

$$ZrO_2(HfO_2)\text{—}Y_2O_3(Dy_2O_3)(Eu_2O_3)\text{—}RE_2O_3(A)\text{-}RE_2O_3(B)\text{—}TiO_2(Nb_2O_3)(Sc_2O_3)\text{—}Ta_2O_5 (Nb_2O_3)(Sc_2O_3)$$

where $RE_2O_3(A)$ and $RE_2O_3(B)$ are Group A and Group B rare earth oxide dopants and equivalent to the third and fourth components described above, respectively. The total dopant oxide content added to the $ZrO_2(HfO_2)$ base oxide is from 3 to 26 molar percent (mol %). More preferably the total dopant oxide composition ranges from 5 to 22 molar percent. Even more preferably, the total dopant oxide composition ranges from 10 to 20 mol %. The composition range of the primary stabilizer dopant is from 1 to 10 mol %. Preferably the composition range of the primary stabilizer dopant is from 2 to 8 mol %. Even more preferably, the composition range of the primary stabilizer dopant is from 2 to 6 mol %. The Group A rare earth oxide dopant ranges from 0.5 to 4 mol % and the Group B rare earth oxide dopant ranges from 0.5 to 4 mol % also. Preferably, the Group A rare earth oxide and Group B rare earth oxide are present in equal molar amounts and both range from 1 to 3 mol %. The total concentration of the transition metal toughening dopants ranges from 1 to 20 mol %, whereas the total concentration of the primary stabilizer dopant, Group A dopant and Group B dopant are in the range of 1 to 12 mol %, and preferably in the range of 2 to 10 mol %. The range of total concentration of the primary stabilizer dopant, Group A dopant and Group B dopant is necessary to ensure the formation and stabilization of the tetragonal structured coating.

In a second embodiment of the present invention the transition metal toughening dopants $TiO_2$ and $Ta_2O_5$ are incorporated into four-component low conductivity coatings which originally exhibit a cubic phase structure. In the alternative, $Nb_2O_3$, $Sc_2O_3$ and combinations thereof may be used to substitute for the $TiO_2$ and/or $Ta_2O_5$ or to dope the $TiO_2$ and/or $Ta_2O_5$. The incorporation of the transition metal toughening dopants improves the coating erosion and toughness performance, by stabilizing the $ZrO_2$ tetragonal phase to the higher dopant region and by forming toughening phases. In this embodiment the total concentration of primary stabilizer dopant, Group A dopant and Group B dopant is in the range of 7 to 20 mol %.

The addition of the Group A dopant, Group B dopant, and the toughening oxide dopants to the zirconia (hafnia)-yttria or other zirconia (hafnia) based systems serves three functions. The first function is the creation of thermodynamically stable, highly defective lattice structures with controlled ranges of defect cluster sizes. The intent of these complex structures is to effectively attenuate and scatter lattice phonon waves as well as radiative photon waves at a wide spectrum of frequencies. This scattering significantly reduces the oxide intrinsic lattice and radiation thermal conductivity.

The second function is the production of highly distorted lattice structures with relatively immobile defect clusters and/or nanoscale ordered phases. The clusters and ordered phases effectively reduce the mobile defect concentration and suppress the atomic mobility and mass transport, thereby significantly improving the oxide sintering-creep resistance of the coating system. The third function is the improvement of the mechanical properties of the coating system, such as fracture toughness and durability, and results from the formation of complex nanoscale defect clusters.

The functions mentioned above are derived from consideration of lattice elastic strain energy and ionic sizes, electroneutrality conditions and oxide free energies of formation. Regarding lattice elastic strain energy and ionic size considerations, one or more pairs of additional dopants incorporated into zirconia (hafnia) coating systems effectively produce lattice distortions in the ceramic alloy solid solutions and facilitate local ionic segregation, commonly known as defect clustering to those skilled in the art. With respect to the electroneutrality consideration, one or more pairs of additional dopants incorporated into the base oxides have cation valencies that are either less than or greater than zirconia. These dopants create a high concentration of highly associated defects which create dopant-oxygen vacancies and strong dopant-dopant interactions, both of which promote the formation of extended, immobile defect clusters. The one or more pairs of additional dopants incorporated in the base oxide systems are also selected based their free energy of formation. A high free energy of formation represents a high stability of the oxide in an oxygen-containing atmosphere. The high free energy of formation also correlates with high polarization of the oxide which further introduces lattice defects and distortion. As stated above, lattice defects and lattice distortion result in a reduced thermal conductivity and improved sintering creep resistance. One further consideration is the atomic weight and solubility considerations of the dopant oxides. A high dopant atomic weight is beneficial for improving lattice scattering. Furthermore, a high dopant solubility is beneficial for increasing dopant concentrations and thus defect concentrations. A mixture of high solubility and low solubility dopants of high and low atomic weight promote complex structures and thus improved lattice scattering.

In order to demonstrate the effectiveness and yet in no way limit the scope of the present invention three examples are given below.

Example 1

Titania and tantala were incorporated within a four-component coating system with a composition of (mol %):

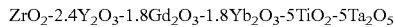
$ZrO_2$-2.4$Y_2O_3$-1.8$Gd_2O_3$-1.8$Yb_2O_3$-5$TiO_2$-5$Ta_2O_5$

FIG. 1 demonstrates the low conductivity of the present invention for plasma-sprayed coatings exposed to steady-state, simulated thermal gradient testing at a surface temperature of between 1500 to 1550° C. The six-component $ZrO_2$-2.4$Y_2O_3$-1.8$Gd_2O_3$-1.8$Yb_2O_3$-5$TiO_2$-5$Ta_2O_5$ coating (shown as ZrYGdYbTiTa in the figure) exhibited low conductivity and high thermal stability compared to a current state-of-the-art $ZrO_2$-8 wt % $Y_2O_3$ baseline coating, a four-component (mol %) $ZrO_2$-2.4$Y_2O_3$-1.8$Gd_2O_3$-1.8$Yb_2O_3$ coating (shown as ZrYGdYb in the figure) and a five-component (mol %) $ZrO_2$-4$Y_2O_3$-3$Gd_2O_3$-3$Yb_2O_3$-5$TiO_2$ coating (shown as ZrYGdYbTi in the figure). In fact, the composition of the present invention provides a one-half to one-third reduction in thermal conductivity compared to the baseline $ZrO_2$-8 wt % $Y_2O_3$ coating.

Example 2

Figure 2:
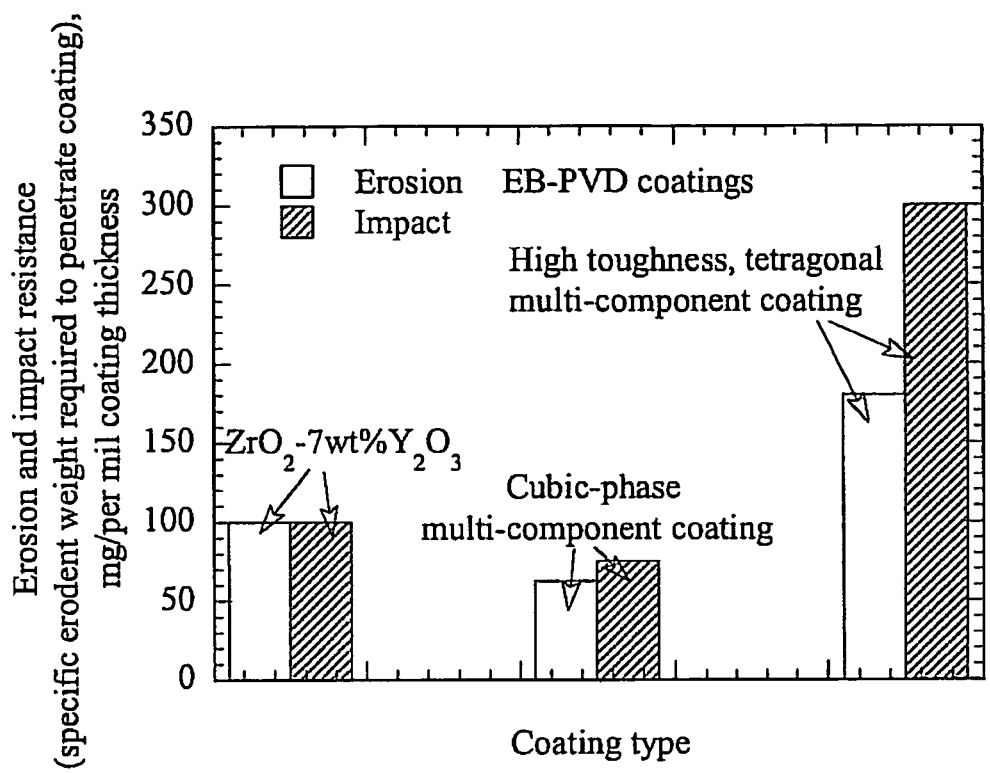
FIG. 2 is a graphical representation of the erosion and impact resistance for various electron beam physical vapor deposition coatings.

Titania and tantala were incorporated within a four-component coating system illustrated by:

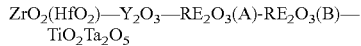
$ZrO_2(HfO_2)$—$Y_2O_3$—$RE_2O_3$(A)-$RE_2O_3$(B)—$TiO_2Ta_2O_5$ in the concentration range of 0.5 to 10 mole percent. FIG. 2 demonstrates the improved erosion and impact resistance of the present invention for electron beam physical vapor deposited coatings exposed to an erodent of alumina ($Al_2O_3$) required to penetrate a unit thickness of the coating. The high toughness tetragonal multi-component coating exhibited significant improvement in erosion and impact resistance compared to a baseline $ZrO_2$-7 wt % $Y_2O_3$ coating and a cubic-phase multi-component coating. In fact, the composition of the present invention provides a factor of two improvement in erosion and impact resistance compared to the baseline $ZrO_2$-7 wt % $Y_2O_3$ coating.

Example 3

Titania and tantala were incorporated within a four-component coating system with a composition of (mol %):

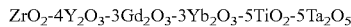
$ZrO_2$-4$Y_2O_3$-3$Gd_2O_3$-3$Yb_2O_3$-5$TiO_2$-5$Ta_2O_5$

Figure 3:
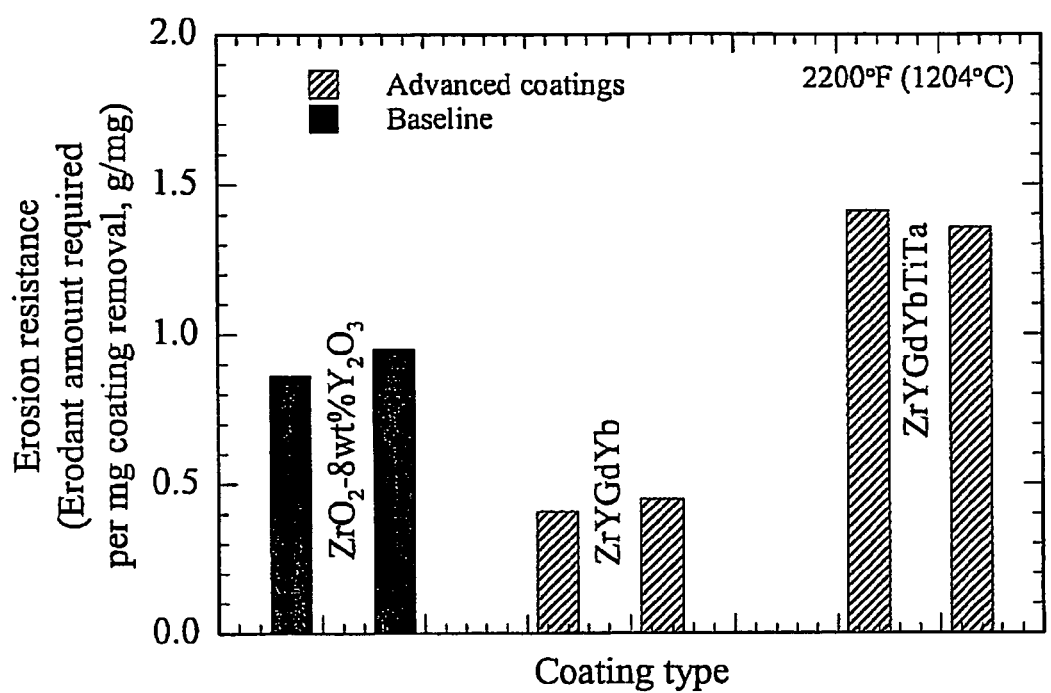
FIG. 3 is a graphical representation of the erosion resistance for various electron beam physical vapor deposition coatings.
Figure 4:
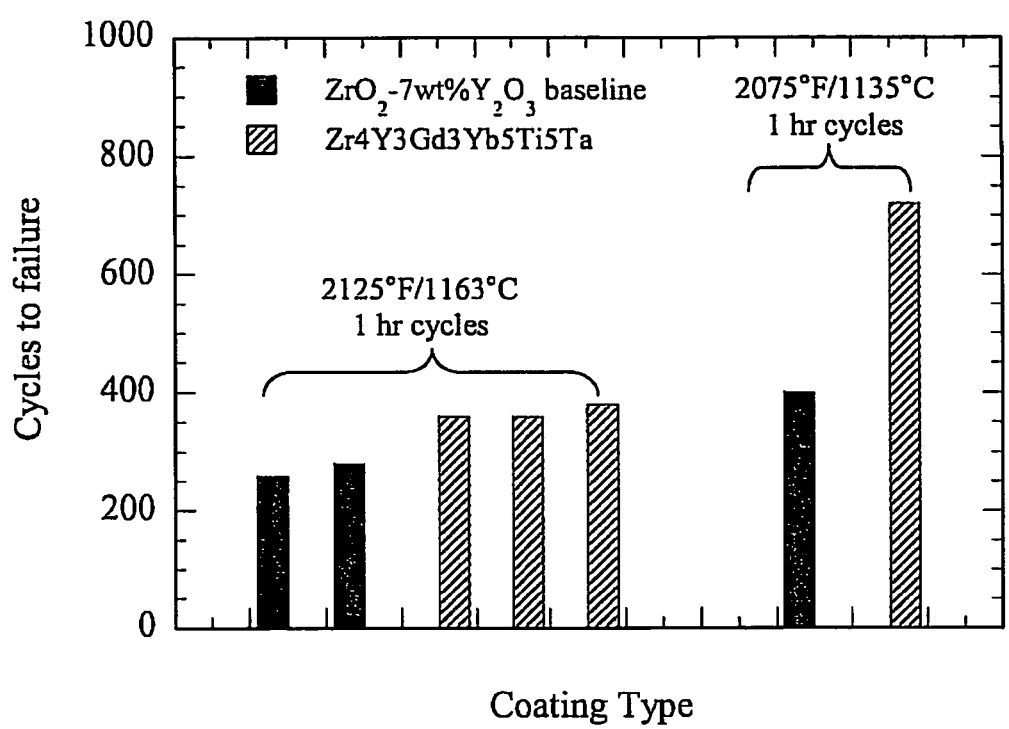
FIG. 4 is a graphical representation of the cyclic oxidation resistance for various electron beam physical vapor deposition coatings.

FIG. 3 demonstrates the improved erosion resistance of the present invention for electron beam physical vapor deposited coatings (shown as ZrYGdYbTiTa in the figure) exposed to an erodent of alumina ($Al_2O_3$) at 1204° C. compared to a four-component (mol %) $ZrO_2$-4$Y_2O_3$-3$Gd_2O_3$-3$Yb_2O_3$ coating (shown as ZrYGdYb in the figure) and a baseline $ZrO_2$-7 wt % $Y_2O_3$ coating. In addition, FIG. 4 illustrates the improved cyclic oxidation resistance of the $ZrO_2$-4$Y_2O_3$-3$Gd_2O_3$-3$Yb_2O_3$-5$TiO_2$-5$Ta_2O_5$ coating (shown as Zr4Y3Gd3Yb5Ti5Ta in the figure) compared to a baseline $ZrO_2$-7 wt % $Y_2O_3$ coating.

The addition of titania and tantala also enhances the oxide atomic bonding of the coating system, thereby resulting in a high chemical stability and intrinsic strength of the oxides. Therefore, the thermal shock resistance and long term durability of the coating are greatly improved while maintaining a low intrinsic thermal conductivity.

The foregoing description is illustrative of particular embodiments of the invention, but is not meant to be a limitation upon the practice thereof. The following claims, including all equivalents thereof, are intended to define the scope of the invention.

The invention claimed is:

1. In a coating composition comprising:
   a base majority component selected from the group consisting of an oxide of zirconium, hafnium and combinations thereof;
   a first dopant oxide selected from the group consisting of an oxide of yttrium, dysprosium, erbium and combinations thereof;
   at least one small rare earth oxide selected from the group consisting of an oxide of ytterbium, holmium, lutetium, scandium, and combinations thereof;
   at least one large rare earth oxide selected from the group consisting of an oxide of neodymium, samarium, europium, gadolinium and combinations thereof; and at least one toughening oxide selected from the group consisting of an tetravalent oxide of titanium, and at least one toughening oxide selected from the group consisting of a pentavalent oxide of tantalum, niobium, and combinations thereof said composition forming a thin layer on a metal substrate.

2. The composition of claim 1, wherein the composition has a defect clustered, large lattice distortion (large t/a ratio) tetragonal crystallographic microstructure.

3. The composition of claim 1, wherein the composition has a tetragonal nano-phase toughened cubic crystallographic microstructure.

4. The composition of claim 1, wherein said first dopant oxide is present from 1 to 10 molar percent.

5. The composition of claim 4, wherein said small rare earth oxide is present from 0.5 to 4 molar percent.

6. The composition of claim 4, wherein said large rare earth oxide is present from 0.5 to 4 molar percent.

7. The composition of claim 1, wherein said at least the first group toughening oxide is present from 1 to 10 molar percent.

8. The composition of claim 7, wherein said dopant oxide plus said small rare earth oxide plus said large rare earth oxide plus said at least one toughening oxide are present from 3 to 30 molar percent.

9. The composition of claim 1, wherein said dopant oxide plus said small rare earth oxide plus said large rare earth oxide are present from 1 to 12 molar percent.

10. The composition of claim 1, further comprising said composition formed as a coating, said coating having a thermal conductivity of less than 1.0 W/m-K.

11. The composition of claim 1, further comprising said composition formed as a coating, said coating having a defect cluster size of from 5 to 100 nanometers.

12. The composition of claim 1, wherein at least the second group toughening oxide is present from 1-10 molar percent.

* * * * *